US008390336B2

(12) United States Patent
Tahata

(10) Patent No.: US 8,390,336 B2
(45) Date of Patent: Mar. 5, 2013

(54) SEMICONDUCTOR APPARATUS AND BREAKDOWN VOLTAGE CONTROL METHOD OF THE SAME

(75) Inventor: Takashi Tahata, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 278 days.

(21) Appl. No.: 12/875,643

(22) Filed: Sep. 3, 2010

(65) Prior Publication Data
US 2011/0057705 A1 Mar. 10, 2011

(30) Foreign Application Priority Data

Sep. 8, 2009 (JP) ................................ 2009-206657

(51) Int. Cl.
*H03K 3/00* (2006.01)
(52) U.S. Cl. ...................................................... 327/108
(58) Field of Classification Search .................. None
See application file for complete search history.

(56) References Cited

U.S. PATENT DOCUMENTS

| 6,128,230 | A  | * | 10/2000 | Amanai   | 365/185.23 |
| 6,177,824 | B1 | * | 1/2001  | Amanai   | 327/333    |
| 7,733,192 | B2 | * | 6/2010  | Yamamoto | 331/177 R  |
| 2009/0051454 | A1 | * | 2/2009 | Yamamoto | 331/177 R  |

FOREIGN PATENT DOCUMENTS

| JP | 7-78885 A    | 3/1995 |
| JP | 11-176950 A  | 7/1999 |
| WO | 97/08833 A1  | 3/1997 |

\* cited by examiner

*Primary Examiner* — Lincoln Donovan
*Assistant Examiner* — Khareem E Almo
(74) *Attorney, Agent, or Firm* — Sughrue Mion, PLLC

(57) ABSTRACT

A semiconductor apparatus operates based on a first voltage, a second voltage lower than the first voltage, and a third voltage in between the first and second voltages, and includes an output circuit including at least one transistor where a signal having an amplitude ranging from the second to first voltages is input to a gate, and a control circuit that generates a first control signal controlling a gate voltage of a transistor included in the output circuit, a second control signal controlling a voltage in a back-gate region of the transistor, and a third control signal controlling a voltage in a deep well region. The control circuit sets a voltage difference between the first and second control signals to be equal to or smaller than the larger one of a voltage difference between the first and third voltages and a voltage difference between the second and third voltages.

15 Claims, 8 Drawing Sheets

SEMICONDUCTOR APPARATUS AND BREAKDOWN VOLTAGE CONTROL METHOD OF THE SAME

INCORPORATION BY REFERENCE

This application is based upon and claims the benefit of priority from Japanese patent application No. 2009-206657, filed on Sep. 8, 2009, the disclosure of which is incorporated herein in its entirety by reference.

BACKGROUND

1. Field of the Invention

The present invention relates to a semiconductor apparatus and, particularly, to a semiconductor apparatus in which a signal having an amplitude equal to or larger than a breakdown voltage of a transistor is input to the gate of the transistor.

2. Description of Related Art

Semiconductor micro-fabrication technology has been developed recently in order to reduce the chip size of a semiconductor apparatus. However, a transistor which is manufactured in a micro-fabrication process has a low breakdown voltage, and when a signal having the same voltage amplitude as it used to be is treated in a semiconductor apparatus which is fabricated in a micro-fabrication process, the amplitude of the signal exceeds the breakdown voltage of the transistor, which results in the breakdown of the semiconductor apparatus. Therefore, even if a device is micro-fabricated by a manufacturing process of the semiconductor apparatus, a micro-fabrication process cannot be used for a circuit that treats a signal with a large amplitude, which raises an issue that the chip size of the semiconductor apparatus cannot be sufficiently reduced.

To address such an issue, International Patent Publication No. WO97/08833 and Japanese Unexamined Patent Application Publication No. H11-176950 discloses one example of a technique for treating a signal having an amplitude equal to or larger than a breakdown voltage of a transistor. According to the technique disclosed therein, transistors are connected in multiple stages between a power supply terminal and a ground terminal, and a voltage applied to each transistor is suppressed to a breakdown voltage or lower. International Patent Publication No. WO97/08833 and Japanese Unexamined Patent Application Publication No. H11-176950 thereby form a circuit that treats a signal having an amplitude of equal to or larger than a breakdown voltage of a transistor Further, Japanese Unexamined Patent Application Publication No. H07-78885 discloses a technique related to a level shifter that converts an input signal with a small amplitude into an output signal with a large amplitude. According to the technique disclosed therein, an inverter is made up of an NMOS transistor and a PMOS transistor that are connected in series between a power supply terminal and a ground terminal. Then, back-gate voltages of the NMOS transistor and the PMOS transistor are adjusted so as to invert the logic level of an output signal for an input signal having a smaller amplitude than a threshold voltage of the inverter, thereby controlling the threshold voltages of the NMOS transistor and the PMOS transistor of the inverter. Japanese Unexamined Patent Application Publication No. H07-78885 thereby allows the threshold voltage of the inverter to correspond to the amplitude of the input signal and inverts the logic level of the output signal having a larger amplitude than the input signal.

SUMMARY

A breakdown voltage of a transistor is determined mainly by a voltage difference between a gate voltage and a back-gate voltage, and, a signal which does not exceed the breakdown voltage is applied to the gate of the transistor in International Patent Publication No. WO97/08833, Japanese Unexamined Patent Application Publication No. H11-176950 and Japanese Unexamined Patent Application Publication No. H07-78885. Therefore, the techniques disclosed therein fail to sufficiently protect the transistor in the event that a signal having an amplitude which exceeds the breakdown voltage of one transistor is input. Therefore, in the techniques disclosed in International Patent Publication No. WO97/08833 and Japanese Unexamined Patent Application Publication No. H11-176950, it is necessary to use many circuit devices in order to form a multistage circuit so as to suppress a voltage applied to each transistor, and there is thus a problem that the chip size cannot be sufficiently reduced. Further, in the technique disclosed in Japanese Unexamined Patent Application Publication No. H07-78885, although the threshold of the transistor can be controlled, it is necessary to use the breakdown voltage which can sufficiently deal with the amplitude of an input signal, and there is also a problem that the chip area cannot be sufficiently reduced.

A first exemplary aspect of the present invention is a semiconductor apparatus that operates based on a first power supply for supplying a first voltage, a second power supply for supplying a second voltage lower than the first voltage, and a third power supply for supplying a third voltage in between the first voltage and the second voltage, which includes an output circuit that includes at least one transistor where a signal having an amplitude ranging from the second voltage to the first voltage is input to a gate, and outputs a first output signal having an amplitude ranging from the second voltage to the first voltage; and a control circuit that generates, based on an input signal, a first control signal for controlling a voltage at a gate of a transistor included in the output circuit, a second control signal for controlling a voltage in a back-gate region of the transistor, and a third control signal for controlling a voltage in a deep well region providing electrical isolation between the back-gate region and a semiconductor substrate region, wherein the control circuit sets a voltage difference between the first control signal and the second control signal to be equal to or smaller than a larger one of a voltage difference between the first voltage and the third voltage and a voltage difference between the second voltage and the third voltage.

A second exemplary aspect of the present invention is a breakdown voltage control method of a semiconductor apparatus including an MOS transistor where a signal having a larger amplitude voltage than a breakdown voltage is input to a gate, which includes, when bringing the MOS transistor into conduction, controlling a back-gate voltage of the MOS transistor to set a voltage difference between a voltage input to the gate and the back-gate voltage to be equal to or smaller than the breakdown voltage; and when bringing the MOS transistor out of conduction, controlling a back-gate voltage of the MOS transistor to set a voltage input to the gate and the back-gate voltage to substantially the same voltage.

In the semiconductor apparatus and the breakdown voltage control method of the same according to the exemplary aspects of the present invention, a voltage of a back-gate region is controlled according to the voltage level of a signal which is input to the gate of a transistor. Then, a voltage difference between a voltage in the back-gate region and a voltage which is applied to the gate of the transistor is set to be smaller than the amplitude voltage of the signal which is input to the gate of the transistor. The semiconductor apparatus and the breakdown voltage control method of the same according to the exemplary aspects of the present invention can thereby protect the transistor from breakdown even when a signal having a larger amplitude voltage than the breakdown voltage of the transistor is input to the transistor.

The semiconductor apparatus and the breakdown voltage control method of the same according to the exemplary aspects of the present invention enable the reduction of a chip area by configuring a circuit using transistors having a smaller breakdown voltage than a signal amplitude voltage of an input signal.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Exemplary embodiments of the present invention will be described hereinafter with reference to the drawings. Firstly, a semiconductor apparatus according to the present invention operates based on a first power supply that supplies a first voltage VH, a second power supply that supplies a second voltage VL which is lower than the first voltage VH, and a third power supply that supplies a third voltage VM which is between the first voltage VH and the second voltage VL. Although the first voltage VH to the third voltage VM have arbitrary voltage values, it is assumed in the following description that the first voltage VH and the second voltage VL have the same voltage difference from the third voltage VM and have different polarities from each other. For example, it is assumed that the first voltage VH is 5V, the second voltage VL is −5V, and the third voltage VM is 0V (ground voltage GND).

Figure 1:
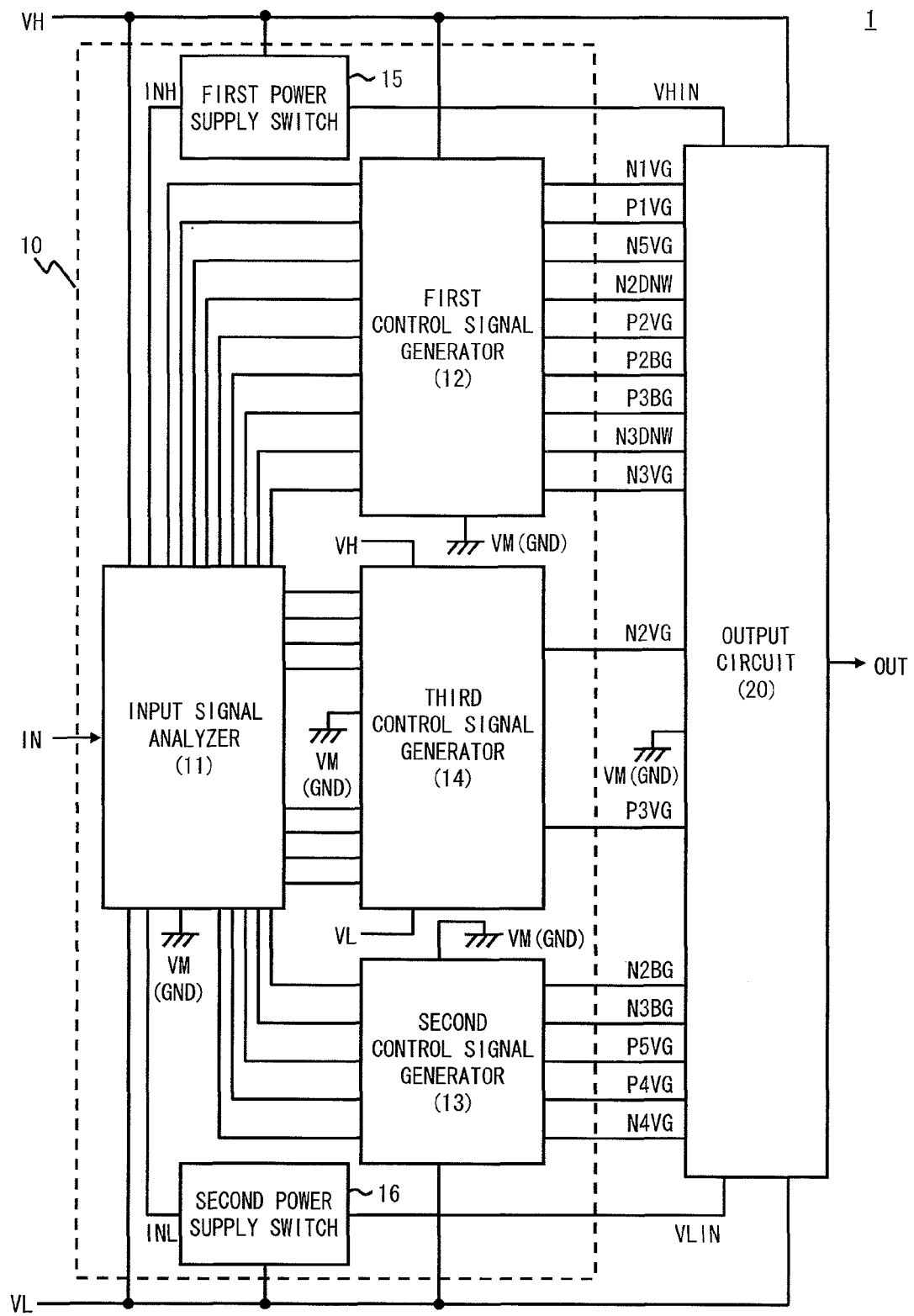
FIG. 1 is a block diagram of a semiconductor apparatus according to a first exemplary embodiment.

FIG. 1 is a block diagram of a semiconductor apparatus 1 according to a first exemplary embodiment. Referring to FIG. 1, the semiconductor apparatus 1 includes a control circuit 10 and an output circuit 20. The control circuit 10 generates, based on an input signal IN, a first control signal that controls the voltage of a gate of a transistor included in the output circuit 20, a second control signal that controls the voltage of a back-gate region of a transistor, and a third control signal that controls the voltage of a deep well region which provides electrical isolation between the back-gate region and a semiconductor substrate region. The output circuit 20 includes at least one transistor in which a signal having the amplitude ranging from the second voltage VL to the first voltage VH is input to its gate, and outputs a first output signal OUT having the amplitude ranging from the first voltage VH to the second voltage VL.

In the semiconductor apparatus 1 according to the exemplary embodiment, the control circuit 10 analyzes the voltage level of the first output signal OUT which corresponds to the input signal IN. Then, the control circuit 10 determines the values of the first control signal to the third control signal to be applied to the respective transistors constituting the output circuit 20 in such a way that the voltage level of the first output signal OUT corresponds to the input signal. At this time, the control circuit 10 sets a voltage difference between the first control signal and the second control signal to be equal to or smaller than the larger one of a voltage difference between the first voltage VH and the third voltage VM and a voltage difference between the second voltage VL and the third voltage VM. In this exemplary embodiment, a voltage difference between the first voltage VH and the third voltage VM and a voltage difference between the second voltage VL and the third voltage VM are substantially the same value (e.g. 5V). In the following description, the details of the control circuit 10 and the output circuit 20 are described.

The control circuit 10 shown in FIG. 1 includes an input signal analyzer 11, a first control signal generator 12, a second control signal generator 13, a third control signal generator 14, a first power supply switch 15, and a second power supply switch 16.

The input signal analyzer 11 analyzes the input signal IN and outputs signal level designation signals that designate the voltage levels of the first control signal to the third control signal to be applied to each transistor. The signal level designation signals are applied to the first control signal generator 12, the second control signal generator 13 and the third control signal generator 14. Further, the input signal analyzer 11 analyzes the input signal IN and outputs power supply switch signals INH and INL to the first power supply switch 15 and the second power supply switch 16, respectively. Note that the input signal IN which is input to the input signal analyzer 11 may be an analog signal having an analog value or a digital signal indicating the voltage level of the output signal OUT by a digital value.

The first control signal generator 12 generates the first control signal to the third control signal having the amplitude ranging from the third voltage VM to the first voltage VH based on the signal level designation signal. In the example of FIG. 1, signals N1VG, P1VG, N5VG, P2VG and N3VG are generated as the first control signal, signals P2BG and P3BG are generated as the second control signal, and signals N2DNW and N3DNW are generated as the third control signal.

Figure 2:
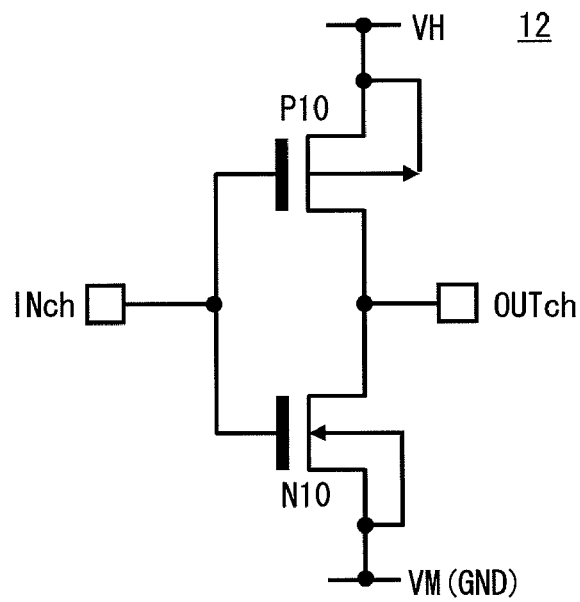
FIG. 2 is a circuit diagram of a first control signal generator according to the first exemplary embodiment.

The detail of the circuit of the first control signal generator 12 is described hereinafter. FIG. 2 is a circuit diagram of the first control signal generator 12. Referring to FIG. 2, the first control signal generator 12 includes a PMOS transistor P10 and an NMOS transistor N10. The PMOS transistor P10 and the NMOS transistor N10 are connected in series between the first power supply and the third power supply and form an inverter. The inverter inverts the logic level of the signal level designation signal which is input through an input terminal INch and outputs the inverted signal. The first control signal generator 12 includes the same number of inverters as the number of control signals to be output. Further, the first control signal to the third control signal which are output from the inverter have the amplitude ranging from the third voltage VM to the first voltage VH according to the voltages of the power supplies that are connected to the inverter.

The second control signal generator 13 generates the first control signal and the second control signal having the amplitude ranging from the second voltage VL to the third voltage VM based on the signal level designation signal. In the example of FIG. 1, signals P5VG, P4VG and N4VG are generated as the first control signal, and signals N2BG and N3BG are generated as the second control signal.

Figure 3:
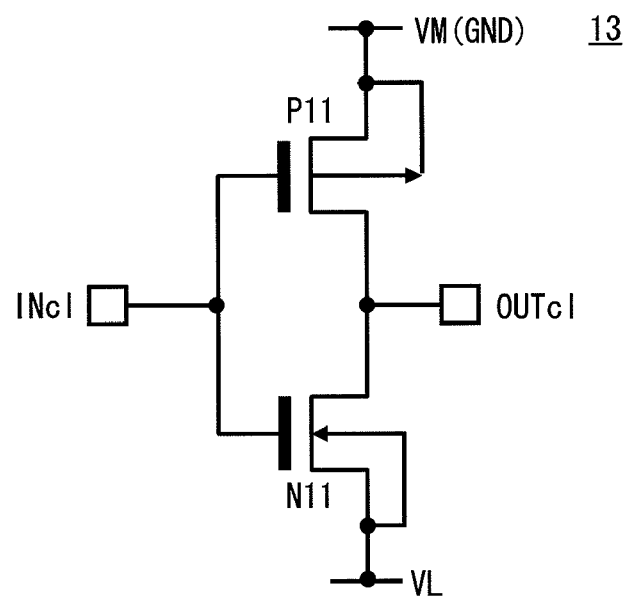
FIG. 3 is a circuit diagram of a second control signal generator according to the first exemplary embodiment.

The detail of the circuit of the second control signal generator 13 is described hereinafter. FIG. 3 is a circuit diagram of the second control signal generator 13. Referring to FIG. 3, the second control signal generator 13 includes a PMOS transistor P11 and an NMOS transistor N11. The PMOS transistor P11 and the NMOS transistor N11 are connected in series between the third power supply and the second power supply and form an inverter. The inverter inverts the logic level of the signal level designation signal which is input through an input terminal INcl and outputs the inverted signal. The second control signal generator 13 includes the same number of inverters as the number of control signals to be output. Further, the first control signal and the second control signal which are output from the inverter have the amplitude ranging from the second voltage VL to the third voltage VM according to the voltages of the power supplies that are connected to the inverter.

The third control signal generator 14 generates the first control signal having the amplitude ranging from the second voltage VL to the first voltage VH based on the signal level designation signal. In the example of FIG. 1, signals N2VG and P3VG are generated as the first control signal.

Figure 4:
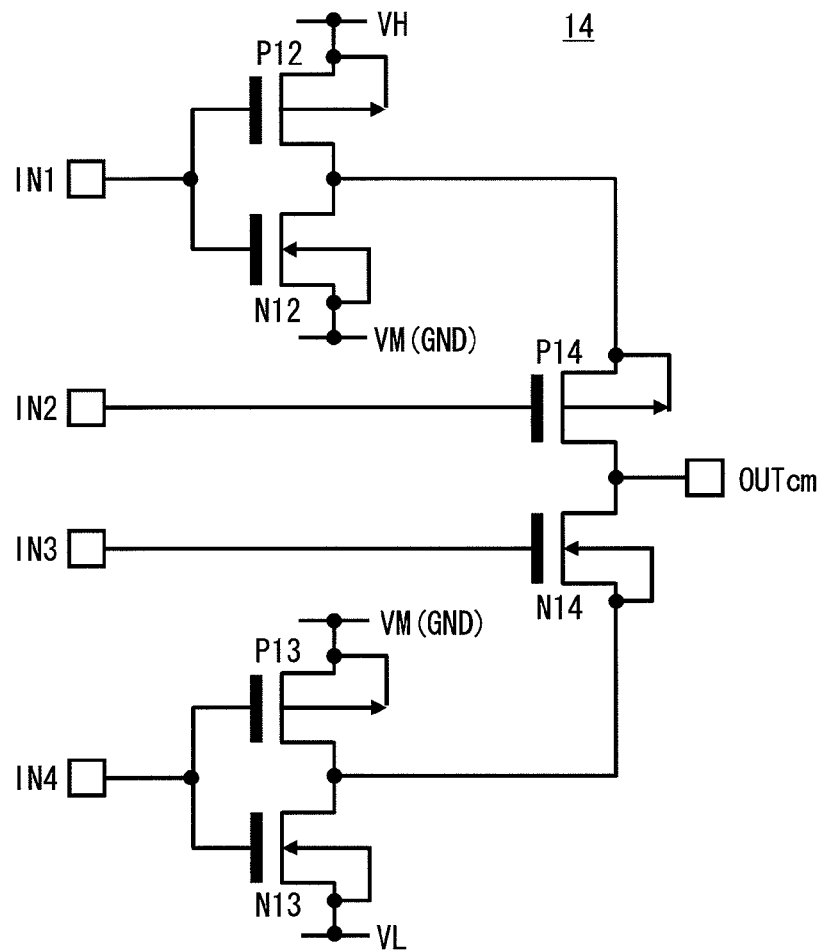
FIG. 4 is a circuit diagram of a third control signal generator according to the first exemplary embodiment.

The detail of the circuit of the third control signal generator 14 is described hereinafter. FIG. 4 is a circuit diagram of the third control signal generator 14. The third control signal generator 14 includes the same number of circuits shown in FIG. 4 as the number of first control signals to be output. Referring to FIG. 4, the third control signal generator 14 includes PMOS transistors P12 to P14 and NMOS transistors N12 to N14. The PMOS transistor P12 and the NMOS transistor N12 are connected in series between the first power supply and the third power supply and form a first inverter. The first inverter inverts the logic level of the signal level designation signal which is input through an input terminal IN1 and outputs the inverted signal. The signal which is output from the first inverter has the amplitude ranging from the third voltage to the first voltage.

The PMOS transistor P13 and the NMOS transistor N13 are connected in series between the third power supply and the second power supply and form a second inverter. The second inverter inverts the logic level of the signal level designation signal which is input through an input terminal IN4 and outputs the inverted signal. The signal which is output from the second inverter has the amplitude ranging from the second voltage to the third voltage.

The gate of the PMOS transistor P14 is supplied with the signal level designation signal, the source of the PMOS transistor P14 is connected to the output of the first inverter, and the drain of the PMOS transistor P14 is connected to an output node. The PMOS transistor P14 receives the signal level designation signal through an input terminal IN2, and the voltage of the signal level designation signal is fixed to the third voltage VM.

The gate of the NMOS transistor N14 is supplied with the signal level designation signal, the source of the NMOS transistor N14 is connected to the output of the second inverter, and the drain of the NMOS transistor N14 is connected to the output node. The voltage of the signal level designation signal which is applied to the NMOS transistor N14 is fixed to the third voltage VM. Further, an output terminal OUTcm is connected to the output node. The NMOS transistor N14 receives the signal level designation signal through an input terminal IN3.

Figure 5:
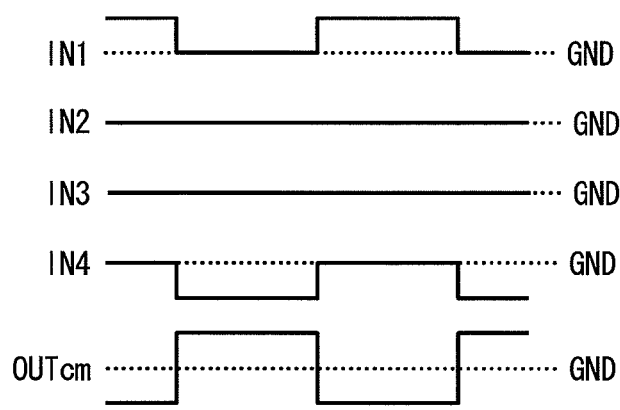
FIG. 5 is a timing chart showing the operation of the third control signal generator according to the first exemplary embodiment.

The operation of the third control signal generator 14 is described hereinbelow. FIG. 5 is a timing chart showing the operation of the third control signal generator 14. Referring to FIG. 5, among the signal level designation signals which are input to the third control signal generator 14, those input through the input terminals IN2 and IN3 are fixed to the third voltage.

In the case where the third control signal generator 14 outputs the Low-level (e.g. −5V) first control signal, the input signal analyzer 11 outputs the High level (e.g. the first voltage (5V)) as the signal level designation signal to be input to the input terminal IN1, and outputs the High level (e.g. the third voltage (0V)) as the signal level designation signal to be input to the input terminal IN4. The first inverter thereby outputs the Low level (e.g. the third voltage (0V)), so that the source-gate voltage of the PMOS transistor P14 becomes 0V, and the PMOS transistor P14 enters a cut-off state. Further, the second inverter thereby outputs the Low level (e.g. the second voltage (−5V)), so that the source-gate voltage of the NMOS transistor N14 becomes 5V, and the NMOS transistor N14 enters a conducting state. Thus, the first control signal which is output from the third control signal generator 14 is Low level (e.g. the second voltage (−5V)) when High-level signals are input to the input terminals IN1 and IN4.

On the other hand, in the case where the third control signal generator 14 outputs the High-level (e.g. 5V) first control signal, the input signal analyzer 11 outputs the Low level (e.g. the third voltage (0V)) as the signal level designation signal to be input to the input terminal IN1, and outputs the Low level (e.g. the second voltage (−5V)) as the signal level designation signal to be input to the input terminal IN4. The first inverter thereby outputs the High level (e.g. the first voltage (5V)), so that the source-gate voltage of the PMOS transistor P14 becomes 5V, and the PMOS transistor P14 enters a conducting state. Further, the second inverter thereby outputs the High level (e.g. the third voltage (0V)), so that the source-gate voltage of the NMOS transistor N14 becomes 0V, and the NMOS transistor N14 enters a cut-off state. Thus, the first control signal which is output from the third control signal generator 14 is High level (e.g. the first voltage (5V) when Low-level signals are input to the input terminals IN1 and IN4.

The first power supply switch 15 switches between the first power supply and the third power supply to be output according to the power supply switch signal INH which is output from the input signal analyzer 11 as a result of analyzing the input signal. The power supply that is output from the first power supply switch 15 is VHIN shown in FIG. 1, which has the voltage value of either the first voltage VH or the third voltage VM. The second power supply switch 16 switches between the third power supply and the second power supply to be output according to the power supply switch signal INL which is output from the input signal analyzer 11 as a result of analyzing the input signal. The power supply that is output from the second power supply switch 16 is VLIN shown in FIG. 1, which has the voltage value of either the third voltage VM or the second voltage VL.

Figure 6:
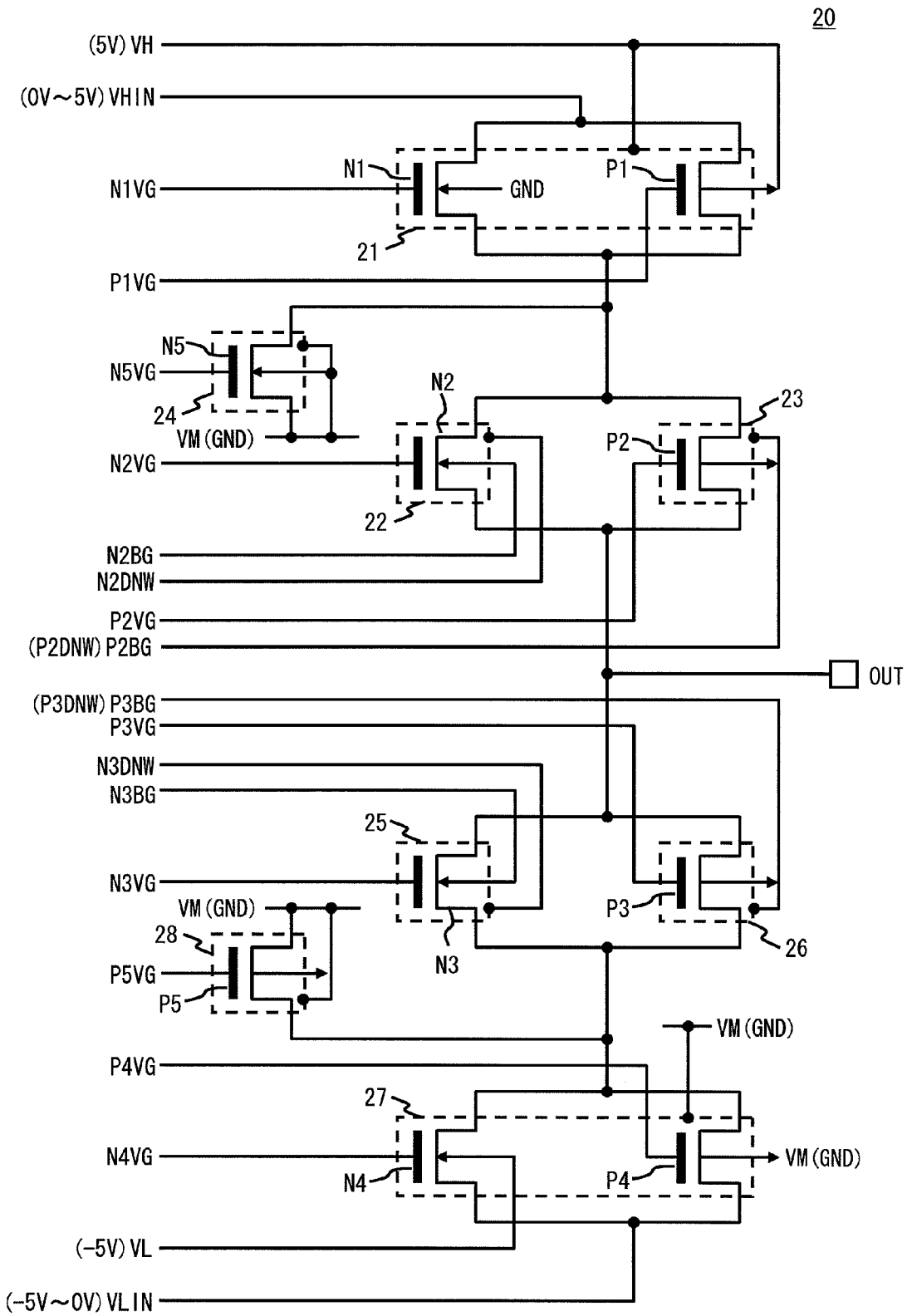
FIG. 6 is a circuit diagram of an output circuit according to the first exemplary embodiment.

Next, the detail of the output circuit 20 is described hereinbelow. FIG. 6 is a circuit diagram of the output circuit 20. The circuit diagram shown in FIG. 6 is an example of the output circuit 20, and the configuration of the output circuit 20 according to the present invention is not limited to the one shown in FIG. 6. Referring to FIG. 6, the output circuit 20 includes first to fourth transfer gates and first and second switch transistors.

The first transfer gate is composed of an NMOS transistor N1 and a PMOS transistor P1. Specifically, the drain of the NMOS transistor N1 and the source of the PMOS transistor P1 are connected to each other and form a first terminal of the first transfer gate. Further, the source of the NMOS transistor N1 and the drain of the PMOS transistor P1 are connected to each other and form a second terminal of the first transfer gate. The power supply VHIN which is output from the first power supply switch 15 is supplied to the first terminal of the first transfer gate. Then, the first control signals whose logic levels are inverted from each other are input to the gate of the NMOS transistor N1 and the gate of the PMOS transistor P1. Note that, in FIG. 1, the first control signal which is input to the gate of the NMOS transistor N1 is indicated by N1VG, and the first control signal which is input to the gate of the PMOS transistor P1 is indicated by P1VG. The first control signals N1VG and P1VG have the amplitude ranging from the third voltage VM to the first voltage VH.

In this exemplary embodiment, the NMOS transistor N1 and the PMOS transistor P1 are formed on one deep well region 21. Then, the first voltage VH is supplied from the first power supply to the deep well region 21. Further, the third voltage VM is supplied as a back-gate voltage to the back-gate region of the NMOS transistor N1. On the other hand, the first voltage VH is supplied as a back-gate voltage to the back-gate region of the PMOS transistor P1. Note that, although the NMOS transistor N1 and the PMOS transistor P1 are formed on one deep well region 21 in this exemplary embodiment, the deep well may be separated for each transistor. Further, it is assumed that the deep well region according to this exemplary embodiment is made of N-type semiconductor.

The second transfer gate is composed of an NMOS transistor N2 and a PMOS transistor P2. Specifically, the drain of the NMOS transistor N2 and the source of the PMOS transistor P2 are connected to each other and form a first terminal of the second transfer gate. Further, the source of the NMOS transistor N2 and the drain of the PMOS transistor P2 are connected to each other and form a second terminal of the second transfer gate. The second terminal of the first transfer gate is connected to the first terminal of the second transfer gate. Further, the second terminal of the second transfer gate is connected to the output terminal. Then, the first control signal N2VG having the amplitude ranging from the second voltage VL to the first voltage VH is supplied to the gate of the NMOS transistor N2. Further, the first control signal P2VG having the voltage value of the third voltage VM is supplied to the gate of the PMOS transistor P2.

In this exemplary embodiment, the NMOS transistor N2 and the PMOS transistor P2 are formed on deep well regions 22 and 23, respectively, which are placed separately. Then, the third control signal N2DNW is supplied to the deep well region 22. Further, the second control signal N2BG is supplied as a back-gate voltage to the back-gate region of the NMOS transistor N2. On the other hand, the second control signal P2BG is supplied to the deep well region 23 and the back-gate region of the PMOS transistor P2, as a signal which is applied in common to the two regions.

The third transfer gate is composed of an NMOS transistor N3 and a PMOS transistor P3. Specifically, the drain of the NMOS transistor N3 and the source of the PMOS transistor P3 are connected to each other and form a first terminal of the third transfer gate. Further, the source of the NMOS transistor N3 and the drain of the PMOS transistor P3 are connected to each other and form a second terminal of the third transfer gate. The output terminal is connected to the first terminal of the third transfer gate. Then, the first control signal N3VG having the voltage value of the third voltage VM is supplied to the gate of the NMOS transistor N3. Further, the first control signal P3VG having the amplitude ranging from the second voltage VL to the first voltage VH is supplied to the gate of the PMOS transistor P3.

In this exemplary embodiment, the NMOS transistor N3 and the PMOS transistor P3 are formed on deep well regions 25 and 26, respectively, which are placed separately. Then, the third control signal N3DNW is supplied to the deep well region 25. Further, the second control signal N3BG is supplied as a back-gate voltage to the back-gate region of the NMOS transistor N3. On the other hand, the second control signal P3BG is supplied to the deep well region 26 and the back-gate region of the PMOS transistor P3, as a signal which is supplied in common to the two regions.

The fourth transfer gate is composed of an NMOS transistor N4 and a PMOS transistor P4. Specifically, the drain of the NMOS transistor N4 and the source of the PMOS transistor P4 are connected to each other and form a first terminal of the fourth transfer gate. Further, the source of the NMOS transistor N4 and the drain of the PMOS transistor P4 are connected to each other and form a second terminal of the fourth transfer gate. The second terminal of the third transfer gate is connected to the first terminal of the fourth transfer gate, and the power supply VLIN which is output from the second power supply switch 16 is supplied to the second terminal of the fourth transfer gate. Then, the first control signals whose logic levels are inverted from each other are input to the gate of the NMOS transistor N4 and the gate of the PMOS transistor P4. Note that, in FIG. 1, the first control signal which is input to the gate of the NMOS transistor N4 is indicated by N4VG, and the first control signal which is input to the gate of the PMOS transistor P4 is indicated by P4VG. The first control signals N4VG and P4VG have the amplitude ranging from the third voltage VM to the first voltage VH.

In this exemplary embodiment, the NMOS transistor N4 and the drain of the PMOS transistor P4 are formed on one deep well region 27. Then, the third voltage VM is supplied from the third power supply to the deep well region 27. Further, the second voltage VL is supplied as a back-gate voltage to the back-gate region of the NMOS transistor N4. On the other hand, the third voltage VM is supplied as a back-gate voltage to the back-gate region of the PMOS transistor P4. Note that, although the NMOS transistor N4 and the drain of the PMOS transistor P4 are formed on one deep well region 27 in this exemplary embodiment, the deep well may be separated for each transistor.

The first switch transistor includes an NMOS transistor N5. The source of the NMOS transistor N5 is connected to the third power supply, and the drain of the NMOS transistor N5 is connected between the second terminal of the first transfer gate and the first terminal of the second transfer gate. Further, the first control signal N5VG is input to the gate of the NMOS transistor N5. In the NMOS transistor N5, a deep well region 24 and a back-gate region are connected to the third power supply, and the third voltage is supplied to those regions.

The second switch transistor includes a PMOS transistor P5. The source of the PMOS transistor P5 is connected to the third power supply, and the drain of the PMOS transistor P5 is connected between the second terminal of the third transfer gate and the first terminal of the fourth transfer gate. Further, the first control signal P5VG is input to the gate of the PMOS transistor P5. In the PMOS transistor P5, a deep well region 28 and a back-gate region are connected to the third power supply, and the third voltage is supplied to those regions.

Figure 7:
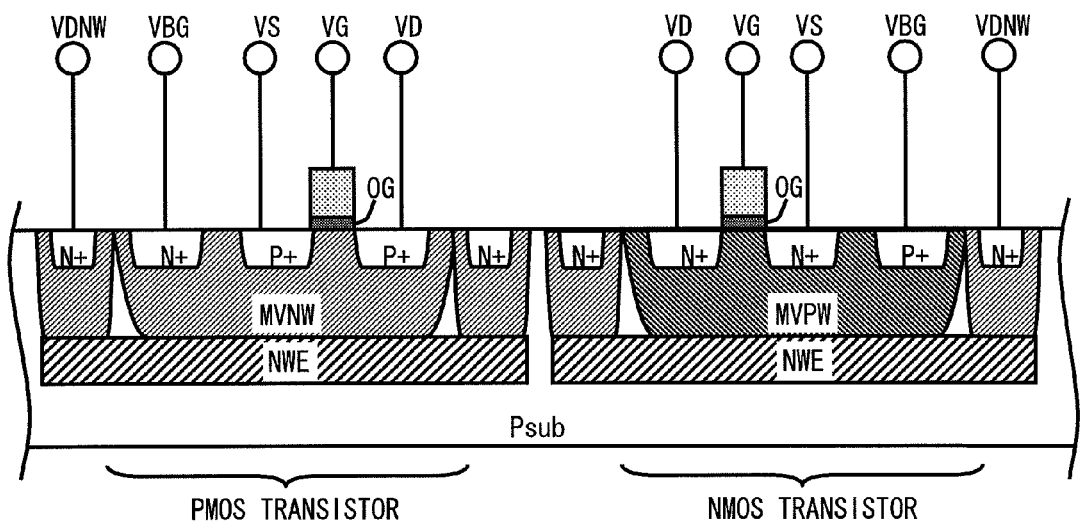
FIG. 7 is a sectional view of the semiconductor apparatus, which shows the structure of a transistor used for the output circuit according to the first exemplary embodiment.

In the output circuit 20 according to the exemplary embodiment, the back-gate voltages of the respective transistors, particularly the NMOS transistors N2 and N3 and the PMOS transistors P2 and P3, are varied by the second and third control signals. Therefore, the transistors that constitute the output circuit 20 according to the exemplary embodiment have a structure in which the back-gate region is electrically isolated from the semiconductor substrate by the deep well region. FIG. 7 is a sectional view of the semiconductor apparatus to explain the cross-sectional structure of the transistors which are used for the output circuit 20.

Referring to FIG. 7, the transistors that constitute the output circuit 20 have deep well regions NWE that are formed on a semiconductor substrate Psub. Further, in the respective upper layers of the deep well regions NEW, a back-gate region MVNW of a PMOS transistor and a back-gate region MVPW of an NMOS transistor are formed. The back-gate region MVNW is an N-type semiconductor region, and the back-gate region MVPW is a P-type semiconductor region.

In the upper layer of the back-gate region MVNW, a source region (a region to which a terminal VS is connected), a drain region (a region to which a terminal VD is connected), and a back-gate tap region (a region to which a terminal VBG is connected) that supplies a voltage to the back-gate region of the PMOS transistor are formed. The source region and the drain region of the PMOS transistor are made of P-type semiconductor, and the back-gate tap region is made of N-type semiconductor. In the upper layer of the back-gate region MVPW, a source region (a region to which a terminal VS is connected), a drain region (a region to which a terminal VD is connected), and a back-gate tap region (a region to which a terminal VBG is connected) that supplies a voltage to the back-gate region of the NMOS transistor are formed. The source region and the drain region of the NMOS transistor are made of N-type semiconductor, and the back-gate tap region is made of P-type semiconductor. Further, a gate electrode (a region to which a terminal VG is connected) is formed on each surface of the back-gate regions MVNW and MVPW through a gate oxide layer OG.

Further, in the same layer as the back-gate regions, a deep well tap region (a region to which a terminal VDNW is connected) that supplies a voltage to the deep well region is formed. The deep well tap region is made of N-type transistor, and the impurity concentration of the region that is exposed at the surface of the semiconductor substrate is high.

The PMOS transistor and the NMOS transistor shown in FIG. 7 provide electrical isolation between the semiconductor substrate Psub and the back-gate regions MVNW and MVPW by supplying the deep well region NWE with a voltage that is equal to or hither than the voltage of the semiconductor substrate Psub. In this exemplary embodiment, it is assumed that the ground voltage GND is supplied from the third power supply to the semiconductor substrate Psub. It is thereby possible in the output circuit 20 according to the exemplary embodiment to appropriately set the back-gate voltage of the transistor according to the voltage level of the signal which is input to the gate of the transistor.

Figure 8:
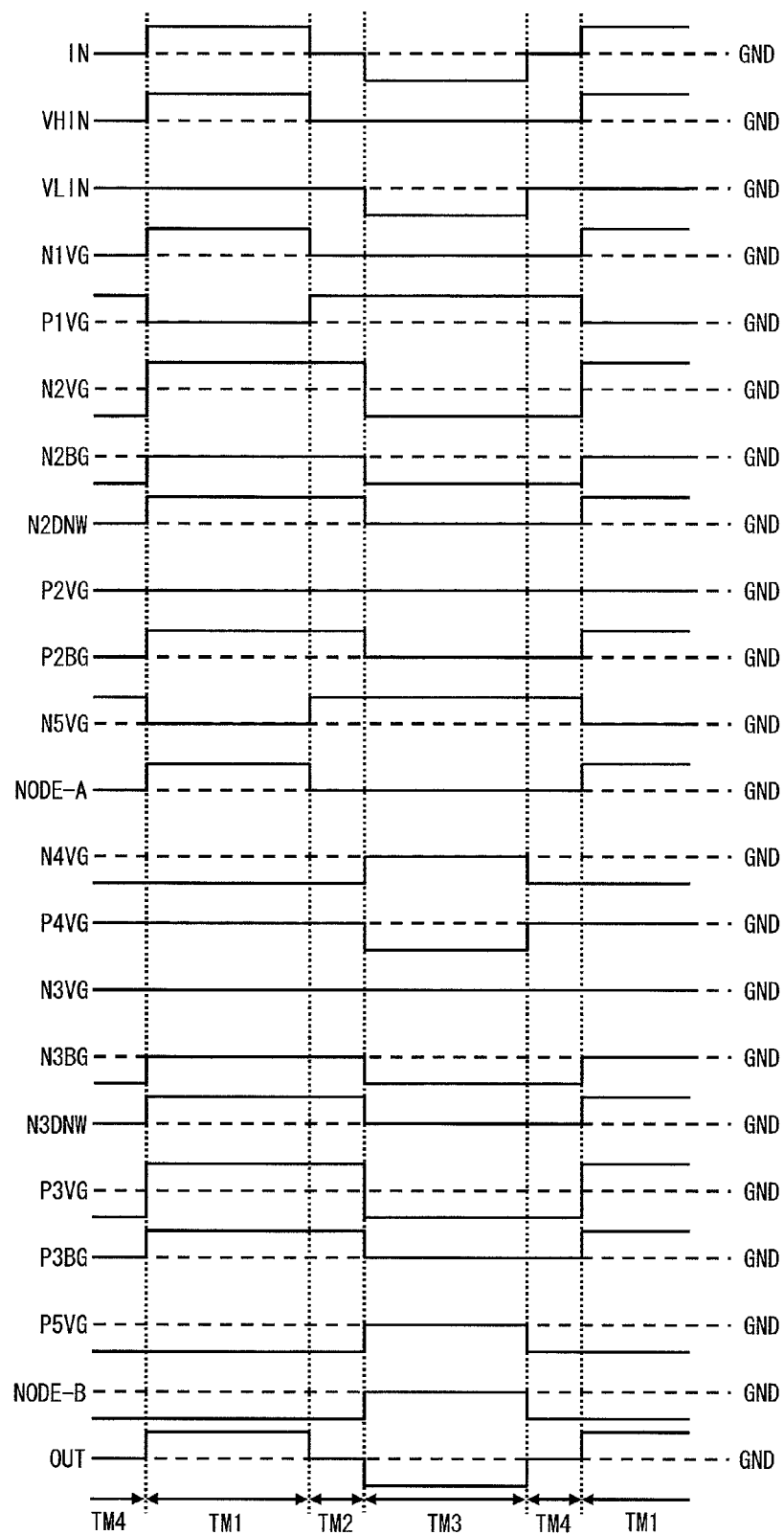
FIG. 8 is a timing chart showing the operation of the semiconductor apparatus according to the first exemplary embodiment.

The operation of the semiconductor apparatus 1 according to the exemplary embodiment is described hereinbelow. FIG. 8 is a timing chart showing the operation of the semiconductor apparatus 1. Referring to FIG. 8, the semiconductor apparatus 1 has four states depending on the voltage level and the voltage transition state of the output signal OUT. Specifically, the semiconductor apparatus 1 has a first period TM1 in which the output signal OUT is the first voltage VH, a second period TM2 in which the previous state of the output signal OUT is the first voltage VH and the current state is the third voltage VM, a third period TM3 in which the output signal OUT is the second voltage VL, and a fourth period TM4 in which the previous state of the output signal OUT is the second voltage VL and the current state is the third voltage VM. In the following description, each of the four periods is described. Note that, in the description of FIG. 7, it is assumed that the first voltage VH is 5V, the second voltage VL is −5V, and the third voltage VM is 0V.

First, the operation of the semiconductor apparatus 1 in the first period TM1 is described. In the first period TM1, a signal of 5V is input as the input signal IN. Then, based on the input signal IN, the control circuit 10 generates the first control signal to the third control signal and the power supplies VHIN and VLIN in such a way that the output signal OUT becomes 5V.

In the first period TM1, the control circuit 10 outputs 5V as the power supply VHIN and outputs 0V as the power supply VLIN. Further, the control circuit 10 sets the first control signal N1VG to 5V and sets the first control signal P1VG to 0V. The NMOS transistor N1 and the PMOS transistor P1 that constitute the first transfer gate thereby both become the conducting state, and the first transfer gate outputs the power supply VHIN (5V) to the second terminal (NODE-A).

Further, the control circuit 10 sets the first control signal N2VG to 5V, sets the second control signal N2BG to 0V, and sets the third control signal N2DNW to 5V. The NMOS transistor N2 of the second transfer gate thereby becomes the conducting state. Furthermore, the control circuit 10 sets the first control signal P2VG to 0V and sets the second control signal P2BG to 5V. The PMOS transistor P2 of the second transfer gate thereby becomes the conducting state. Accordingly, the two transistors of the second transfer gate become the conducting state, and thereby outputs the voltage (5V) of the power supply VHIN which is input to the first terminal (NODE-A) to the second terminal.

Furthermore, the control circuit 10 sets the first control signal N5VG to 0V. The NMOS transistor N5 thereby becomes the cut-off state.

On the other hand, the control circuit 10 sets the first control signal N4VG to −5V and sets the first control signal P4VG to 0V. The NMOS transistor N4 and the PMOS transistor P4 that constitute the fourth transfer gate thereby both become the cut-off state.

Further, the control circuit 10 sets the first control signal N3VG to 0V, sets the second control signal N3BG to 0V, and sets the third control signal N3DNW to 5V. The NMOS transistor N3 of the third transfer gate thereby becomes the cut-off state. Furthermore, the control circuit 10 sets the first control signal P3VG to 5V and sets the second control signal P3BG to 5V. The PMOS transistor P3 of the third transfer gate thereby becomes the cut-off state. Accordingly, the third transfer gate enters the cut-off state.

Furthermore, the control circuit 10 sets the first control signal P5VG to −5V. The PMOS transistor P5 thereby becomes the conducting state. Thus, 0V is supplied to the node (NODE-B) between the third transfer gate and the fourth transfer gate.

By the above operation, in the first period TM1, the output signal OUT having the voltage level of 5V is output to the output terminal of the output circuit 20 through the first and second transfer gates. At this time, in the NMOS transistor N1, a voltage difference between the source and the drain is 0V, and a voltage difference between the gate and the back-gate region is 5V. In the PMOS transistor P1, a voltage difference between the source and the drain is 0V, and a voltage difference between the gate and the back-gate region is 5V. In the NMOS transistor N2, a voltage difference between the source and the drain is 0V, a voltage difference between the gate and the back-gate region is 5V, and a voltage difference between the back-gate region and the deep well region is 5V. In the PMOS transistor P2, a voltage difference between the source and the drain is 0V, and a voltage difference between the gate and the back-gate region is 5V. In the NMOS transistor N3, a voltage difference between the source and the drain is 5V, a voltage difference between the gate and the back-gate region is 0V, and a voltage difference between the back-gate region and the deep well region is 5V. In the PMOS transistor P3, a voltage difference between the source and the drain is 5V, and a voltage difference between the gate and the back-gate region is 0V. In the NMOS transistor N4, a voltage difference between the source and the drain is 0V, and a voltage difference between the gate and the back-gate region is 0V. In the PMOS transistor P4, a voltage difference between the source and the drain is 0V, and a voltage difference between the gate and the back-gate region is 0V. In the NMOS transistor N5, a voltage difference between the source and the drain is 5V, and a voltage difference between the gate and the back-gate region is 0V. In the PMOS transistor P5, a voltage difference between the source and the drain is 0V, and a voltage difference between the gate and the back-gate region is 5V. Accordingly, during the first period TM1, the semiconductor apparatus 1 is in the state where the voltage of the output signal OUT is 5V and a voltage difference between the terminals of the respective transistors constituting the output circuit 20 is equal to or smaller than 5V.

Next, the operation of the semiconductor apparatus 1 in the second period TM2 is described. In the second period TM2, a signal of 0V is input as the input signal IN. Then, based on the input signal IN, the control circuit 10 generates the first control signal to the third control signal and the power supplies VHIN and VLIN in such a way that the output signal OUT becomes 0V. Further, in the state transition from the first period TM1 to the second period TM2, the control circuit 10 makes control so as to minimize a change in the states of the transistors of the output circuit 20, thereby suppressing an increase in power consumption.

In the second period TM2, the control circuit 10 outputs 0V as the power supply VHIN and outputs 0V as the power supply VLIN. Further, the control circuit 10 sets the first control signal N1VG to 0V and sets the first control signal P1VG to 5V. The NMOS transistor N1 and the PMOS transistor P1 that constitute the first transfer gate thereby both become the cut-off state, so that the first transfer gate enters the cut-off state.

Further, the control circuit 10 sets the first control signal N5VG to 5V. The NMOS transistor N5 thereby becomes the conducting state. Thus, 0V is supplied to the node (NODE-A) between the first transfer gate and the second transfer gate.

Furthermore, the control circuit 10 sets the first control signal N2VG to 5V, sets the second control signal N2BG to 0V, and sets the third control signal N2DNW to 5V. The NMOS transistor N2 of the second transfer gate thereby becomes the conducting state. Furthermore, the control circuit 10 sets the first control signal P2VG to 0V and sets the second control signal P2BG to 5V. The PMOS transistor P2 of the second transfer gate thereby becomes the conducting state. Accordingly, the two transistors of the second transfer gate become the conducting state, and thereby outputs the voltage (0V) which is input to the first terminal (NODE-A) to the second terminal.

On the other hand, the control circuit 10 sets the first control signal N4VG to −5V and sets the first control signal P4VG to 0V. The NMOS transistor N4 and the PMOS transistor P4 that constitute the fourth transfer gate thereby both become the cut-off state.

Further, the control circuit 10 sets the first control signal N3VG to 0V, sets the second control signal N3BG to 0V, and sets the third control signal N3DNW to 5V. The NMOS transistor N3 of the third transfer gate thereby becomes the cut-off state. Furthermore, the control circuit 10 sets the first control signal P3VG to 5V and sets the second control signal P3BG to 5V. The PMOS transistor P3 of the third transfer gate thereby becomes the cut-off state. Accordingly, the third transfer gate enters the cut-off state.

Furthermore, the control circuit 10 sets the first control signal P5VG to −5V. The PMOS transistor P5 thereby becomes the conducting state. Thus, 0V is supplied to the node (NODE-B) between the third transfer gate and the fourth transfer gate.

By the above operation, in the second period TM2, the output signal OUT having the voltage level of 0V is output to the output terminal of the output circuit 20 through the second transfer gate. At this time, in the NMOS transistor N1, a voltage difference between the source and the drain is 0V, and a voltage difference between the gate and the back-gate region is 0V. In the PMOS transistor P1, a voltage difference between the source and the drain is 0V, and a voltage difference between the gate and the back-gate region is 0V. In the NMOS transistor N2, a voltage difference between the source and the drain is 0V, a voltage difference between the gate and the back-gate region is 5V, and a voltage difference between the back-gate region and the deep well region is 5V. In the PMOS transistor P2, a voltage difference between the source and the drain is 0V, and a voltage difference between the gate and the back-gate region is 5V. In the NMOS transistor N3, a voltage difference between the source and the drain is 0V, a voltage difference between the gate and the back-gate region is 0V, and a voltage difference between the back-gate region and the deep well region is 5V. In the PMOS transistor P3, a voltage difference between the source and the drain is 0V, and a voltage difference between the gate and the back-gate region is 0V. In the NMOS transistor N4, a voltage difference between the source and the drain is 0V, and a voltage difference between the gate and the back-gate region is 0V. In the PMOS transistor P4, a voltage difference between the source and the drain is 0V, and a voltage difference between the gate and the back-gate region is 0V. In the NMOS transistor N5, a voltage difference between the source and the drain is 0V, and a voltage difference between the gate and the back-gate region is 5V. In the PMOS transistor P5, a voltage difference between the source and the drain is 0V, and a voltage difference between the gate and the back-gate region is 5V. Accordingly, during the second period TM2, the semiconductor apparatus 1 is in the state where the voltage of the output signal OUT is 0V and a voltage difference between the terminals of the respective transistors constituting the output circuit 20 is equal to or smaller than 5V.

Next, the operation of the semiconductor apparatus 1 in the third period TM3 is described. In the third period TM3, a signal of −5V is input as the input signal IN. Then, based on the input signal IN, the control circuit 10 generates the first control signal to the third control signal and the power supplies VHIN and VLIN in such a way that the output signal OUT becomes −5V.

In the third period TM3, the control circuit 10 outputs 0V as the power supply VHIN and outputs −5V as the power supply VLIN. Further, the control circuit 10 sets the first control signal N1VG to 0V and sets the first control signal P1VG to 5V. The NMOS transistor N1 and the PMOS transistor P1 that constitute the first transfer gate thereby both become the cut-off state, so that the first transfer gate enters the cut-off state.

Further, the control circuit 10 sets the first control signal N2VG to −5V, sets the second control signal N2BG to −5V, and sets the third control signal N2DNW to 0V. The NMOS transistor N2 of the second transfer gate thereby becomes the cut-off state. Furthermore, the control circuit 10 sets the first control signal P2VG to 0V and sets the second control signal P2BG to 0V. The PMOS transistor P2 of the second transfer gate thereby becomes the cut-off state. Accordingly, the second transfer gate enters the cut-off state.

Further, the control circuit 10 sets the first control signal N5VG to 5V. The NMOS transistor N5 thereby becomes the conducting state. Thus, 0V is supplied to the node (NODE-A) between the first transfer gate and the second transfer gate.

On the other hand, the control circuit 10 sets the first control signal N4VG to 0V and sets the first control signal P4VG to −5V. The NMOS transistor N4 and the PMOS transistor P4 that constitute the fourth transfer gate thereby both become the conducting state, and the fourth transfer gate outputs the power supply VLIN (−5V) to the first terminal (NODE-B).

Further, the control circuit 10 sets the first control signal N3VG to 0V, sets the second control signal N3BG to −5V, and sets the third control signal N3DNW to 0V. The NMOS transistor N3 of the third transfer gate thereby becomes the conducting state. Furthermore, the control circuit 10 sets the first control signal P3VG to −5V and sets the second control signal P3BG to 0V. The PMOS transistor P3 of the third transfer gate thereby becomes the conducting state. Accordingly, the two transistors of the third transfer gate become the conducting state, and thereby outputs the voltage (−5V) of the power supply VLIN which is input to the second terminal (NODE-B) to the first terminal.

Furthermore, the control circuit 10 sets the first control signal P5VG to 0V. The PMOS transistor P5 thereby becomes the cut-off state.

By the above operation, in the third period TM3, the output signal OUT having the voltage level of −5V is output to the output terminal of the output circuit 20 through the third and fourth transfer gates. At this time, in the NMOS transistor N1, a voltage difference between the source and the drain is 0V, and a voltage difference between the gate and the back-gate region is 0V. In the PMOS transistor P1, a voltage difference between the source and the drain is 0V, and a voltage difference between the gate and the back-gate region is 0V. In the NMOS transistor N2, a voltage difference between the source and the drain is 5V, a voltage difference between the gate and the back-gate region is 0V, and a voltage difference between the back-gate region and the deep well region is 5V. In the PMOS transistor P2, a voltage difference between the source and the drain is 5V, and a voltage difference between the gate and the back-gate region is 0V. In the NMOS transistor N3, a voltage difference between the source and the drain is 0V, a voltage difference between the gate and the back-gate region is 5V, and a voltage difference between the back-gate region and the deep well region is 5V. In the PMOS transistor P3, a voltage difference between the source and the drain is 0V, and a voltage difference between the gate and the back-gate region is 5V. In the NMOS transistor N4, a voltage difference between the source and the drain is 0V, and a voltage difference between the gate and the back-gate region is 5V. In the PMOS transistor P4, a voltage difference between the source and the drain is 5V, and a voltage difference between the gate and the back-gate region is 5V. In the NMOS transistor N5, a voltage difference between the source and the drain is 0V, and a voltage difference between the gate and the back-gate region is 5V. In the PMOS transistor P5, a voltage difference between the source and the drain is 5V, and a voltage difference between the gate and the back-gate region is 0V. Accordingly, during the third period TM3, the semiconductor apparatus 1 is in the state where the voltage of the output signal OUT is −5V and a voltage difference between the terminals of the respective transistors constituting the output circuit 20 is equal to or smaller than 5V.

Next, the operation of the semiconductor apparatus 1 in the fourth period TM4 is described. In the fourth period TM4, a signal of 0V is input as the input signal IN. Then, based on the input signal IN, the control circuit 10 generates the first control signal to the third control signal and the power supplies VHIN and VLIN in such a way that the output signal OUT becomes 0V. Further, in the state transition from the third period TM3 to the fourth period TM4, the control circuit 10 makes control so as to minimize a change in the states of the transistors of the output circuit 20, thereby suppressing an increase in power consumption.

In the fourth period TM4, the control circuit 10 outputs 0V as the power supply VHIN and outputs 0V as the power supply VLIN. Further, the control circuit 10 sets the first control signal N1VG to 0V and sets the first control signal P1VG to 5V. The NMOS transistor N1 and the PMOS transistor P1 that constitute the first transfer gate thereby both become the cut-off state, so that the first transfer gate enters the cut-off state.

Further, the control circuit 10 sets the first control signal N2VG to −5V, sets the second control signal N2BG to −5V, and sets the third control signal N2DNW to 0V. The NMOS transistor N2 of the second transfer gate thereby becomes the cut-off state. Furthermore, the control circuit 10 sets the first control signal P2VG to 0V and sets the second control signal P2BG to 0V. The PMOS transistor P2 of the second transfer gate thereby becomes the cut-off state. Accordingly, the second transfer gate enters the cut-off state.

Further, the control circuit 10 sets the first control signal N5VG to 5V. The NMOS transistor N5 thereby becomes the conducting state. Thus, 0V is supplied to the node (NODE-A) between the first transfer gate and the second transfer gate.

On the other hand, the control circuit 10 sets the first control signal N4VG to −5V and sets the first control signal P4VG to 0V. The NMOS transistor N4 and the PMOS transistor P4 that constitute the fourth transfer gate thereby both become the cut-off state.

Further, the control circuit 10 sets the first control signal N3VG to 0V, sets the second control signal N3BG to −5V, and sets the third control signal N3DNW to 0V. The NMOS transistor N3 of the third transfer gate thereby becomes the conducting state. Furthermore, the control circuit 10 sets the first control signal P3VG to −5V and sets the second control signal P3BG to 0V. The PMOS transistor P3 of the third transfer gate thereby becomes the conducting state. Accordingly, the two transistors of the third transfer gate become the conducting state, and thereby outputs the voltage (−5V) of the power supply VLIN which is input to the second terminal (NODE-B) to the first terminal.

Furthermore, the control circuit 10 sets the first control signal P5VG to −5V. The PMOS transistor P5 thereby becomes the conducting state. Thus, 0V is supplied to the node (NODE-B) between the third transfer gate and the fourth transfer gate.

By the above operation, in the fourth period TM4, the output signal OUT having the voltage level of 0V is output to the output terminal of the output circuit 20 through the third transfer gate. At this time, in the NMOS transistor N1, a voltage difference between the source and the drain is 0V, and a voltage difference between the gate and the back-gate region is 0V. In the PMOS transistor P1, a voltage difference between the source and the drain is 0V, and a voltage difference between the gate and the back-gate region is 0V. In the NMOS transistor N2, a voltage difference between the source and the drain is 0V, a voltage difference between the gate and the back-gate region is 0V, and a voltage difference between the back-gate region and the deep well region is 5V. In the PMOS transistor P2, a voltage difference between the source and the drain is 0V, and a voltage difference between the gate and the back-gate region is 0V. In the NMOS transistor N3, a voltage difference between the source and the drain is 0V, a voltage difference between the gate and the back-gate region is 5V, and a voltage difference between the back-gate region and the deep well region is 5V. In the PMOS transistor P3, a voltage difference between the source and the drain is 0V, and a voltage difference between the gate and the back-gate region is 5V. In the NMOS transistor N4, a voltage difference between the source and the drain is 0V, and a voltage difference between the gate and the back-gate region is 0V. In the PMOS transistor P4, a voltage difference between the source and the drain is 0V, and a voltage difference between the gate and the back-gate region is 0V. In the NMOS transistor N5, a voltage difference between the source and the drain is 0V, and a voltage difference between the gate and the back-gate region is 5V. In the PMOS transistor P5, a voltage difference between the source and the drain is 0V, and a voltage difference between the gate and the back-gate region is 5V. Accordingly, during the fourth period TM4, the semiconductor apparatus 1 is in the state where the voltage of the output signal OUT is 0V and a voltage difference between the terminals of the respective transistors constituting the output circuit 20 is equal to or smaller than 5V.

As described above, in the semiconductor apparatus 1 according to the exemplary embodiment, the control circuit 10 controls a back-gate voltage of a transistor according to a voltage which is input to the gate of the transistor. Then, the control circuit 10 sets a voltage difference between the gate voltage and the back-gate voltage of the transistor to be smaller than the maximum amplitude of the signal which is input to the gate of the transistor. In the above description, control on the NMOS transistor N2 and the PMOS transistor P3 of the output circuit 20 is particularly characteristic. Specifically, in the semiconductor apparatus 1 according to the exemplary embodiment, even when a signal having the amplitude which exceeds a breakdown voltage of one transistor is input to the transistor, a voltage difference between the gate and the back-gate region of the transistor is set to be equal to or smaller than the breakdown voltage of the transistor by controlling the back-gate voltage of the transistor. In the above-described exemplary embodiment, the breakdown voltage of 5V is sufficient for the NMOS transistor N2 and the PMOS transistor P2 to which a signal having the amplitude of 10V is input to their gates. Consequently, in the semiconductor apparatus 1 according to the exemplary embodiment, a circuit can be configured by using transistors having a lower breakdown voltage than the amplitude voltage of a signal to be treated, and it is thereby possible to reduce the chip size of the semiconductor apparatus.

Further, in the semiconductor apparatus 1 according to the exemplary embodiment, the control circuit 10 controls a voltage difference between the source and the drain of the transistors of the output circuit 20 to be smaller than the amplitude voltage of a signal to be treated. It is thereby possible in the semiconductor apparatus 1 to reduce a breakdown voltage between the source and the drain of transistors. The reduction of the breakdown voltage between the source and the drain of transistors enables the use of finer transistors, and it is thereby possible to reduce the chip size of the semiconductor apparatus.

Furthermore, in the control circuit 10 (e.g. the third control signal generator 14) of the semiconductor apparatus 1 according to the exemplary embodiment, the first inverter and the second inverter generate signals within the breakdown voltage of transistors. In the third control signal generator 14, when the voltage level of the first control signal is the first voltage VH, the NMOS switch transistor prevents the second inverter from being affected by the first voltage VH, and, when the voltage level of the first control signal is the second voltage VL, the PMOS switch transistor prevents the first inverter from being affected by the second voltage VL. It is thereby possible to configure the third control signal generator 14 by using transistors having a lower breakdown voltage than the amplitude voltage of the first control signal to be output.

In addition, in the semiconductor apparatus 1 according to the exemplary embodiment, a voltage difference between the third voltage VM and the first voltage VH and a voltage difference between the second voltage VL and the third voltage VM are set to the same voltage. In this manner, by setting the third voltage VM to be the intermediate (½ voltage) between the first voltage VH and the second voltage VL, it is possible to maximize the effect of transistor breakdown protection for a voltage difference between the first voltage VH and the second voltage VL.

Second Exemplary Embodiment

In a semiconductor apparatus 2 according to a second exemplary embodiment, a buffer circuit 29 is placed at the output of the semiconductor apparatus 1 according to the first exemplary embodiment. The semiconductor apparatus 2 according to the second exemplary embodiment controls the voltage level of a power supply which is supplied to the buffer circuit 29 and thereby sets a voltage difference between the gate and the back-gate region of a transistor that constitutes the buffer circuit 29 to be equal to or smaller than the breakdown voltage of the transistor.

Figure 9:
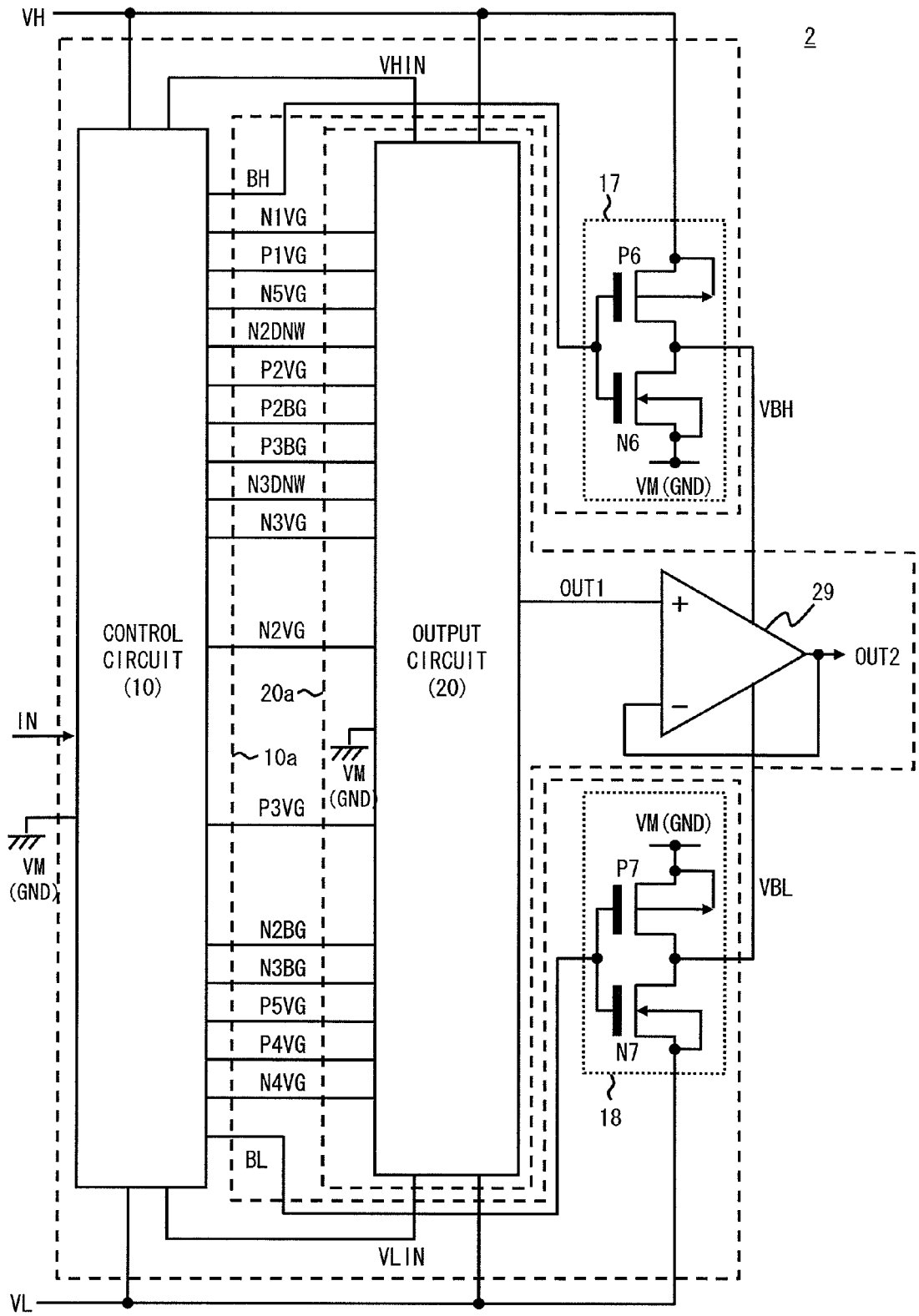
FIG. 9 is a block diagram of a semiconductor apparatus according to a second exemplary embodiment.

FIG. 9 is a block diagram of the semiconductor apparatus 2 according to the second exemplary embodiment. Referring to FIG. 9, the semiconductor apparatus 2 includes a control circuit 10a which is an alternative example of the control circuit 10 of the semiconductor apparatus 1, and an output circuit 20a which is an alternative example of the output circuit 20 of the semiconductor apparatus 1.

The control circuit 10a includes a first buffer power supply circuit 17 and a second buffer power supply circuit 18 in addition to the control circuit 10. Further, the control circuit 10a outputs a fourth control signal BH that controls the first buffer power supply circuit 17 and a fifth control signal BL that controls the second buffer power supply circuit 18. The fourth control signal BH is output by the first control signal generator 12 of the control circuit 10, and the fifth control signal BL is output by the second control signal generator 13 of the control circuit 10.

The first buffer power supply circuit 17 includes a PMOS transistor P6 and an NMOS transistor N6. The PMOS transistor P6 and the NMOS transistor N6 are connected in series between the first power supply and the third power supply and form an inverter. The inverter inverts the logic level of the fourth control signal BH and outputs the inverted signal. The signal which is output from the inverter is a first buffer power supply VBH, which is a high-potential-side power supply of the buffer circuit 29.

The second buffer power supply circuit 18 includes a PMOS transistor P7 and an NMOS transistor N7. The PMOS transistor P7 and the NMOS transistor N7 are connected in series between the third power supply and the second power supply and form an inverter. The inverter inverts the logic level of the fifth control signal BL and outputs the inverted signal. The signal which is output from the inverter is a second buffer power supply VBL, which is a low-potential-side power supply of the buffer circuit 29.

The output circuit 20a includes the buffer circuit 29 which is placed at the output terminal of the output circuit 20. In FIG. 9, a first output signal OUT1 is a signal which corresponds to the output signal OUT of the first exemplary embodiment, and a second output signal OUT2 is a signal which is output from the buffer circuit 29. The buffer circuit 29 forms a differential amplifier. The first output signal OUT1 is input to the non-inverting input terminal of the buffer circuit 29, and the buffer circuit 29 amplifies the current of the first output signal OUT1 to thereby generate the second output signal OUT2. The differential amplifier is composed of an NMOS transistor whose back-gate region is connected to the second buffer power supply VBL and a PMOS transistor whose back-gate region is connected to the first buffer power supply VBH. Further, the transistors that constitute the differential amplifier have deep well regions and thus have a structure in which the semiconductor substrate and the back-gate regions are isolated from each other.

Figure 10:
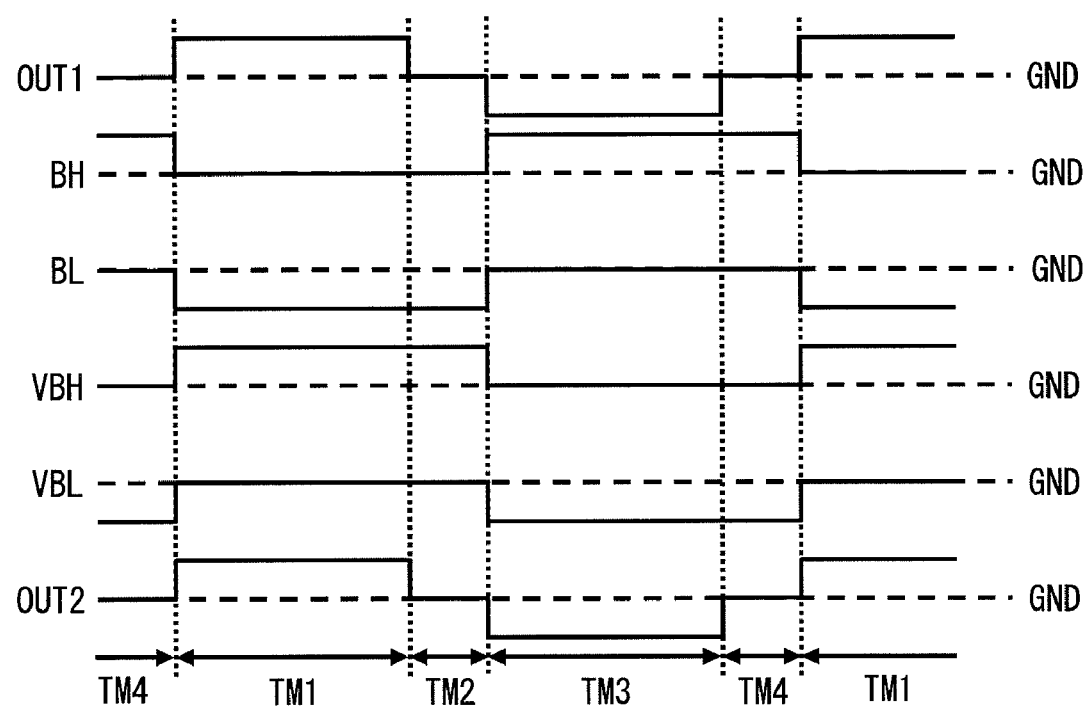
FIG. 10 is a timing chart showing the operation of a buffer power supply circuit and an output circuit according to the second exemplary embodiment.

In the semiconductor apparatus 2, the control circuit 10a controls the voltage level of the first output signal OUT1 which is output from the output circuit 20 according to the input signal. Then, the control circuit 10a controls the voltage levels of the power supplies to be applied to the buffer circuit 29 according to the first voltage level which is output from the output circuit 20 by using the first buffer power supply circuit 17 and the second buffer power supply circuit 18. FIG. 10 is a timing chart to explain the operation of the control circuit 10a.

Referring to FIG. 10, when the voltage level of the first output signal OUT1 is the first voltage VH, the control circuit 10a sets the fourth control signal BH to the third voltage VM (e.g. 0V), and sets the fifth control signal BL to the second voltage VL. Then, based on the fourth control signal BH and the fifth control signal BL, the first buffer power supply VBH becomes the first voltage VH, and the second buffer power supply VBL becomes the third voltage VM (e.g. 0V). Consequently, a voltage difference between the power supplies which are supplied to the buffer circuit 29 is 5V, and the power supply range is a sufficient value for generating the second output signal OUT2 with the same voltage level as the first output signal OUT1.

Further, when the voltage level of the first output signal OUT1 is the second voltage VL, the control circuit 10a sets the fourth control signal BH to the first voltage VH, and sets the fifth control signal BL to the third voltage VM (e.g. 0V). Then, based on the fourth control signal BH and the fifth control signal BL, the first buffer power supply VBH becomes the third voltage VM (e.g. 0V), and the second buffer power supply VBL becomes the second voltage VL. Consequently, a voltage difference between the power supplies which are supplied to the buffer circuit 29 is 5V, and the power supply range is a sufficient value for generating the second output signal OUT2 with the same voltage level as the first output signal OUT1.

As described above, in the semiconductor apparatus 2 according to the second exemplary embodiment, the buffer circuit 29 is configured by using transistors whose back-gate voltage is controllable, and the power supply range which is applied to the buffer circuit 29 is shifted according to an input signal (e.g. the first output signal OUT1). Accordingly, in the buffer circuit 29, a voltage difference between the input signal which is input to the gate of the transistor and the back-gate voltage of the transistor can be smaller than the amplitude voltage of the input signal. Consequently, in the semiconductor apparatus 2 according to the second exemplary embodiment also, the buffer circuit 29 can be configured by using transistors having a lower breakdown voltage than the amplitude of an input signal, and it is thereby possible to reduce the chip size.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor apparatus that operates based on a first power supply for supplying a first voltage, a second power supply for supplying a second voltage lower than the first voltage, and a third power supply for supplying a third voltage in between the first voltage and the second voltage, comprising:
    an output circuit that includes at least one transistor where a signal having an amplitude ranging from the second voltage to the first voltage is input to a gate, and outputs a first output signal having an amplitude ranging from the second voltage to the first voltage; and
    a control circuit that generates, based on an input signal, a first control signal for controlling a voltage at a gate of a transistor included in the output circuit, a second control signal for controlling a voltage in a back-gate region of the transistor, and a third control signal for controlling a voltage in a deep well region providing electrical isolation between the back-gate region and a semiconductor substrate region,
    wherein the control circuit sets a voltage difference between the first control signal and the second control signal to be equal to or smaller than a larger one of a voltage difference between the first voltage and the third voltage and a voltage difference between the second voltage and the third voltage.

2. The semiconductor apparatus according to claim 1, wherein
    the control circuit generates the first control signal having an amplitude ranging from the second voltage to the first voltage,
    when bringing an NMOS transistor among the transistor into conduction, the control circuit sets a voltage difference between the first control signal and the second control signal to a voltage difference between the first voltage and the third voltage and sets a voltage difference between the third control signal and the second control signal to a voltage difference between the first voltage and the third voltage, when bringing the NMOS transistor out of conduction, the control circuit sets the first to third control signals to the second voltage, when bringing a PMOS transistor among the transistor into conduction, the control circuit sets a voltage difference between the first control signal and the second control signal to a voltage difference between the second voltage and the third voltage and sets the third control signal and the second control signal to the third voltage, and when bringing the PMOS transistor out of conduction, the control circuit sets the first to third control signals to the first voltage.

3. The semiconductor apparatus according to claim 2, wherein the NMOS transistor and the PMOS transistor have the deep well region.

4. The semiconductor apparatus according to claim 1, wherein the control circuit generates the first control signal set to the third voltage;

when bringing an NMOS transistor among the transistor into conduction, the control circuit sets the second control signal to the second voltage and sets the third control signal to the third voltage, when bringing the NMOS transistor out of conduction, the control circuit sets the second control signal to the third voltage and sets the third control signal to the first voltage, when bringing a PMOS transistor among the transistor into conduction, the control circuit sets the second and third control signals to the first voltage, and when bringing the PMOS transistor out of conduction, the control circuit sets the second and third control signals to the third voltage.

5. The semiconductor apparatus according to claim 4, wherein the NMOS transistor and the PMOS transistor have the deep well region.

6. The semiconductor apparatus according to claim 1, wherein the output circuit includes:
  a buffer circuit that amplifies a current of the first output signal and outputs the amplified signal as a second output signal, the control circuit includes:
  a first buffer power supply circuit that switches a high-potential-side power supply voltage of the buffer circuit; and
  a second buffer power supply circuit that switches a low-potential-side power supply voltage of the buffer circuit, when the first output signal is the first voltage, the control circuit supplies the first power supply by the first buffer power supply circuit and supplies the third power supply by the second buffer power supply circuit, and when the first output signal is the second voltage, the control circuit supplies the third power supply by the first buffer power supply circuit and supplies the second power supply by the second buffer power supply circuit.

7. The semiconductor apparatus according to claim 1, wherein the control circuit includes:

an input signal analyzer that analyzes the input signal and outputs a signal level designation signal for designating voltage levels of the first to third control signals to be applied to each transistor;

a first control signal generator that generates the first to third control signals having an amplitude ranging from the third voltage to the first voltage based on the signal level designation signal;

a second control signal generator that generates the first and second control signals having an amplitude ranging from the second voltage to the third voltage based on the signal level designation signal; and a third control signal generator that generates the first control signal having an amplitude ranging from the second voltage to the first voltage based on the signal level designation signal.

8. The semiconductor apparatus according to claim 7, wherein the third control signal generator includes:
  a first inverter composed of an NMOS transistor and a PMOS transistor connected in series between the third power supply and the first power supply;
  a PMOS switch transistor where the third voltage is applied to a gate, a source is connected to an output of the first inverter, and a drain is connected to an output node;
  a second inverter composed of an NMOS transistor and a PMOS transistor connected in series between the second power supply and the third power supply; and
  an NMOS switch transistor where the third voltage is applied to a gate, a source is connected to an output of the second inverter, and a drain is connected to the output node, the first inverter inverts and outputs a signal having an amplitude ranging from the third voltage to the first voltage among the signal level designation signal, and the second inverter inverts and outputs a signal having an amplitude ranging from the second voltage to the third voltage among the signal level designation signal.

9. The semiconductor apparatus according to claim 1, wherein the control circuit includes:
  a first power supply switch that switches between the first power supply and the third power supply and outputs either one according to the input signal; and
  a second power supply switch that switches between the second power supply and the third power supply and outputs either one according to the input signal, the output circuit includes:
  a first transfer gate that has a first terminal connected to an output of the first power supply switch;
  a second transfer gate that has a first terminal connected to a second terminal of the first transfer gate, and a second terminal connected to an output terminal;
  a third transfer gate that has a first terminal connected to the output terminal;
  a fourth transfer gate that has a first terminal connected to a second terminal of the third transfer gate, and a second terminal connected to an output of the second power supply switch;
  a first switch transistor that is connected between the third power supply and a node between the first and second transfer gates; and
  a second switch transistor that is connected between the third power supply and a node between the third and fourth transfer gates, conduction states of transistors constituting the first to fourth transfer gates and the first and second switch transistors are controlled by the first to third control signals output from the control circuit, when the first voltage is output from the output terminal, the third and fourth transfer gates and the first switch transistor become a conducting state, the first and second transfer gates and the second switch transistor become a cut-off state, the first power supply switch outputs the first power supply, and the second power supply switch outputs the third power supply, and when the second voltage is output from the output terminal, the third and fourth transfer gates and the first switch transistor become a cut-off state, the first and second transfer gates and the second switch transistor become a conducting state, the first power supply switch outputs the third power supply, and the second power supply switch outputs the second power supply.

10. The semiconductor apparatus according to claim 9, wherein
the first power supply is supplied to the back-gate region and the deep well region of a transistor constituting the first transfer gate, and
the second power supply is supplied to the back-gate region and the deep well region of a transistor constituting the fourth transfer gate.

11. The semiconductor apparatus according to claim 1, wherein the first voltage and the second voltage have substantially the same voltage difference from the third voltage.

12. A breakdown voltage control method of a semiconductor apparatus including an MOS transistor where a signal having a larger amplitude voltage than a breakdown voltage is input to a gate, comprising:
when bringing the MOS transistor into conduction, controlling a back-gate voltage of the MOS transistor to set a voltage difference between a voltage input to the gate and the back-gate voltage to be equal to or smaller than the breakdown voltage; and when bringing the MOS transistor out of conduction, controlling a back-gate voltage of the MOS transistor to set a voltage input to the gate and the back-gate voltage to substantially the same voltage.

13. The breakdown voltage control method of the semiconductor apparatus according to claim 12, wherein
an amplitude voltage of the signal input to the gate is substantially twice the breakdown voltage, and
when bringing the MOS transistor into conduction, a back-gate voltage of the MOS transistor is controlled to set a voltage difference between a voltage input to the gate and the back-gate voltage to be ½ of the amplitude voltage.

14. The breakdown voltage control method of the semiconductor apparatus according to claim 12, wherein
the MOS transistor includes a deep well region providing electrical isolation between a back-gate region supplied with the back-gate voltage and a semiconductor substrate region,
when the MOS transistor has N-type conductivity, a voltage difference between the back-gate voltage and a voltage of the deep well region is set to be equal to or smaller than the breakdown voltage, and
when the MOS transistor has P-type conductivity, the back-gate voltage and a voltage of the deep well region are set to substantially the same potential.

15. The breakdown voltage control method of the semiconductor apparatus according to claim 14, wherein
an amplitude voltage of the signal input to the gate is substantially twice the breakdown voltage, and
when bringing the MOS transistor into conduction, a back-gate voltage of the MOS transistor is controlled to set a voltage difference between a voltage input to the gate and the back-gate voltage to be ½ of the amplitude voltage.

* * * * *